United States Patent [19]
Barnes et al.

[11] Patent Number: 5,750,956
[45] Date of Patent: May 12, 1998

[54] METHODS OF MANUFACTURING PERFORATED FOILS

[75] Inventors: Clive Barnes, Oxford; Trevor John Crichton, Chesham, both of Great Britain

[73] Assignee: Braun Aktiengesellschaft, Kronberg, Germany

[21] Appl. No.: 307,815

[22] PCT Filed: Mar. 30, 1993

[86] PCT No.: PCT/EP93/00772

§ 371 Date: Jan. 10, 1995

§ 102(e) Date: Jan. 10, 1995

[87] PCT Pub. No.: WO93/19887

PCT Pub. Date: Oct. 14, 1993

[30] Foreign Application Priority Data

Mar. 31, 1992 [GB] United Kingdom ............ 9207054

[51] Int. Cl.$^6$ .................................................. B23K 26/00
[52] U.S. Cl. ................... 219/121.71; 360/346.51; 427/555
[58] Field of Search .......................... 219/121.7, 121.71, 219/121.69; 30/346.51; 216/65; 427/555, 556; 210/498, 500.25

[56] References Cited

U.S. PATENT DOCUMENTS

| | | |
|---|---|---|
| 4,056,992 | 11/1977 | Blume ........................... 76/104 R |
| 4,184,250 | 1/1980 | Meijer ........................... 30/346.51 |
| 4,262,186 | 4/1981 | Provancher ........................... 219/121.7 |
| 4,391,885 | 7/1983 | Tomita et al. ........................... 427/555 |
| 4,490,211 | 12/1984 | Chen et al. ........................... 216/65 |
| 4,575,406 | 3/1986 | Slater ........................... 210/500.25 |
| 4,780,177 | 10/1988 | Wojnarowski et al. ........................... 216/65 |
| 4,801,379 | 1/1989 | Ehrsam et al. ........................... 210/498 |
| 4,857,698 | 8/1989 | Perun ........................... 219/121.71 |
| 4,879,451 | 11/1989 | Gart ........................... 219/121.71 |
| 4,900,581 | 2/1990 | Stuke et al. ........................... 427/555 |
| 4,981,715 | 1/1991 | Hirsch et al. ........................... 427/555 |
| 5,017,460 | 5/1991 | Schuurman ........................... 30/346.51 |
| 5,304,772 | 4/1994 | Snakenborg ........................... 219/121.71 |

FOREIGN PATENT DOCUMENTS

2605216  8/1977  Germany .

*Primary Examiner*—Geoffrey S. Evans
*Attorney, Agent, or Firm*—Fish & Richardson P.C.

[57] ABSTRACT

Foils are manufactured by creating a pattern on a substrate and then thickening the patterned film. The foil may then be peeled away from the substrate and/or pattern. The patterning step may include use of a laser or use of a photoresist, and may include deposition of a further layer. The thickening step may be performed by electrodeposition or electroless methods. The foils produced may be employed for dry shavers, sieves or filters.

39 Claims, 8 Drawing Sheets

METHODS OF MANUFACTURING PERFORATED FOILS

This invention relates to methods of manufacturing perforated foils, e.g. foils for dry shavers, filters, sieves or the like, to a method of manufacturing dry shavers, and to foils manufactured by the methods.

A known process for manufacturing foils for dry shavers will now be described. A first step of creating a pattern of holes in a metal foil is carried out using a photo resist. In a preparatory step, a steel plate is cleaned and dip-coated with photo resist. The photo resist is then exposed through a mask and developed to generate the foil pattern. This photo resist pattern is then cured in an oven.

Next, the plate carrying the pattern is transferred to a pre-nickel electroforming tank, for electroforming with nickel to a thickness of approximately 25 microns. Then the plate is transferred to a passivation tank, and finally it is transferred to a main electroforming tank in order to electroform a main layer of nickel onto the foil to a thickness of 60 microns. The nickel foil can then be peeled away from the plate.

This whole process has various disadvantages. It is time consuming and involves many stages. It occupies a significant amount of workspace, and requires a significant amount of time and effort in transferring the plate from stage to stage. By its nature, the process is discontinuous and only produces foils in batches. Also, the photo resist process creates troublesome effluents as by-products.

Accordingly, it is an object of the present invention to provide an improved method of manufacturing perforated foils.

According to one aspect of the invention, there is provided a method of manufacturing a perforated foil e.g. for a filter, a sieve, a dry shaver, or the like, comprising the steps of: creating a pattern of holes in an electrically conductive film using a laser; and thickening the patterned film.

According to another aspect of the invention, there is provided a method of manufacturing a perforated foil e.g. for a filter, a sieve, a dry shaver, or the like, comprising the steps of: creating a pattern of holes in an electrically-conductive film supported on an electrically insulating substrate; and thickening the patterned film.

The pattern of holes may be created by patterning and developing a layer of photoresist.

But by the use of a laser, manufacturing time can be reduced, the space required for manufacturing can be reduced, and the amount of effluents produced as by-products can be reduced since the photo resist developing and curing stages are no longer required.

Preferably, the laser creates the holes by removing material in a mainly photochemical ablative process.

Preferably the laser is an ultraviolet excimer laser, and a suitable mask or image projection technique is used to create the pattern of holes.

The film, e.g. a metal film or foil, may be present on one or both sides of a plastic sheet, or other electrically insulating substrate, which may be sufficiently flexible to be stored on a reel, thus reducing space requirements for storage.

The thickening step preferably includes forming at least one layer of material containing nickel or copper on the patterned film.

If the film is present on only one side of the substrate, and the combination is sufficiently flexible, it may be shaped into an arch before carrying out any further step of forming at least one layer of material containing nickel or copper on the patterned foil. This is of advantage in the preparation of foils for electric shavers, since it enables the foil to be produced in the required arched configuration without any strain imposed on the material.

A preferred feature involves providing the film in continuous strip form which is easier to handle in manufacturing than individual portions.

Preferably, the composite layer of film and substrate should not be so thick as to become rigid.

Preferably, when using a laser the thickness of the film is between 0.05 and 0.25 microns, before any thickening step.

Advantageously, the nickel forming step may be carried out by electroforming using a continuous reel to reel type plating unit.

For a better understanding of the invention, and to show more clearly how the same may be carried into effect, reference will now be made by way of example, to the accompanying drawings, in which.

Figure 1:
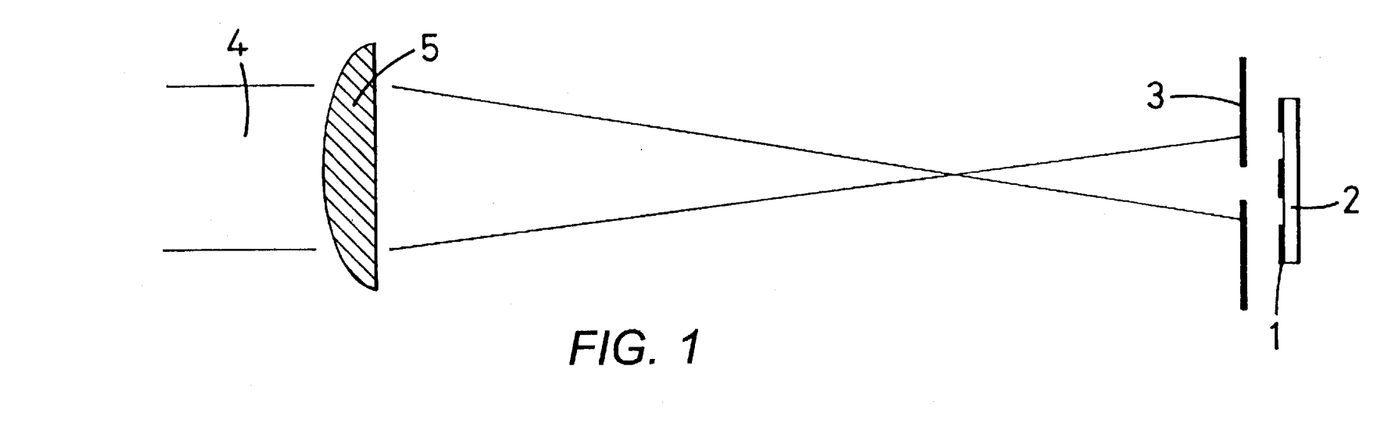
FIG. 1 shows schematically a first process for ablating holes in a metal film using a laser and a mask according to an embodiment of the invention.

Referring first to FIG. 1, this shows schematically one embodiment of a photo ablative process for creating holes in a metal film. The film comprises a thin metal layer 1 preferably of copper, aluminium or stainless steel, but other metals could be used. The film is carried by a thin substrate 2, which is preferably plastics or a similar material, which should be cheap, strong and water resistant (i.e. not liable to dissolve or degrade).

The plastic substrate material 2 employed to carry the film 1 will either be transparent or resistant to the laser light. Most preferably, the laser will be operated in such manner as to leave the surface of the plastic substantially undamaged. This is particularly advantageous in that the undamaged surface of the plastic material defines the surface of the foil during any subsequent thickening process (see below).

An excimer laser produces a beam 4 which illuminates the surface of the film in order to generate holes. The beam 4 is directed by a focusing lens 5 onto specific predetermined parts of the material via a mask 3 to define a hole pattern. In FIG. 1 the mask 3 is used in proximity to, or in contact with the film (contact processing).

Figure 2:
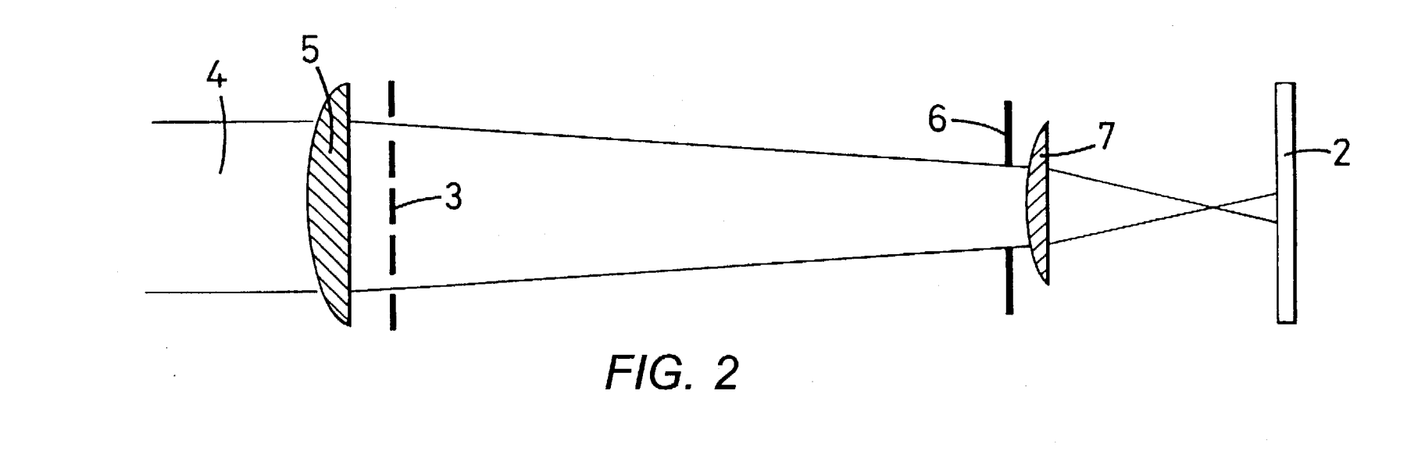
FIG. 2 shows schematically a second process for ablating holes in a metal film using a laser and a mask according to a further embodiment of the invention.

FIG. 2 shows an alternative method of projecting the mask pattern onto the surface of the film. In this method, referred to as projection processing, the mask 3 is placed next to a field lens 5 so that the excimer laser beam 4 passes through the lens 5, through the mask 3 and then passes to a focusing system comprising a variable aperture 6 and an imaging lens 7.

Figure 3:
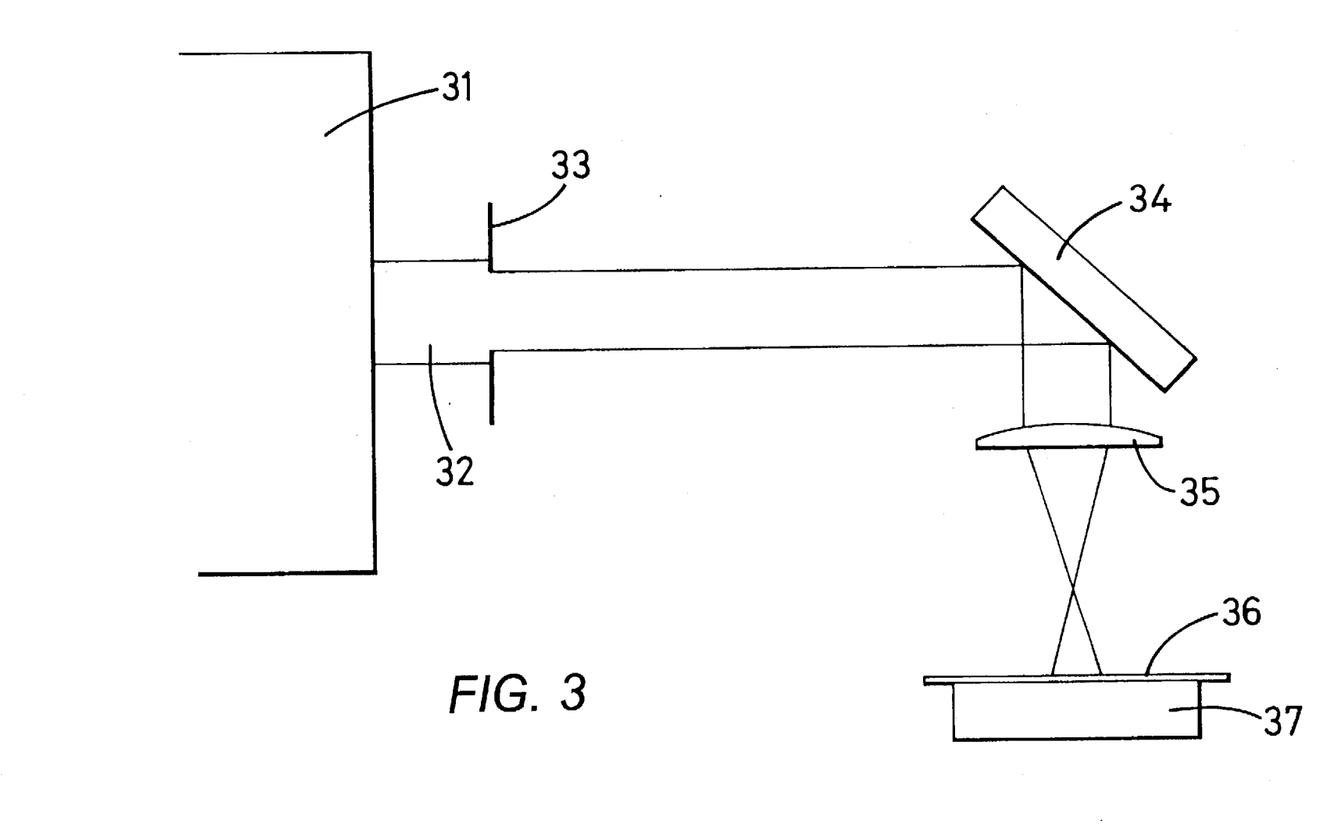
FIG. 3 shows a schematic representation of apparatus for performing a process of the type shown in FIG. 1.

FIG. 3 shows a more detailed implementation of contact processing. An excimer laser 31 produces a beam 32 which passes through an aperture 33 and onto a mirror 34. The mirror reflects the beam through a converging lens 35, which concentrates the beam onto a mask 36 on a film/substrate 37.

Figure 4:
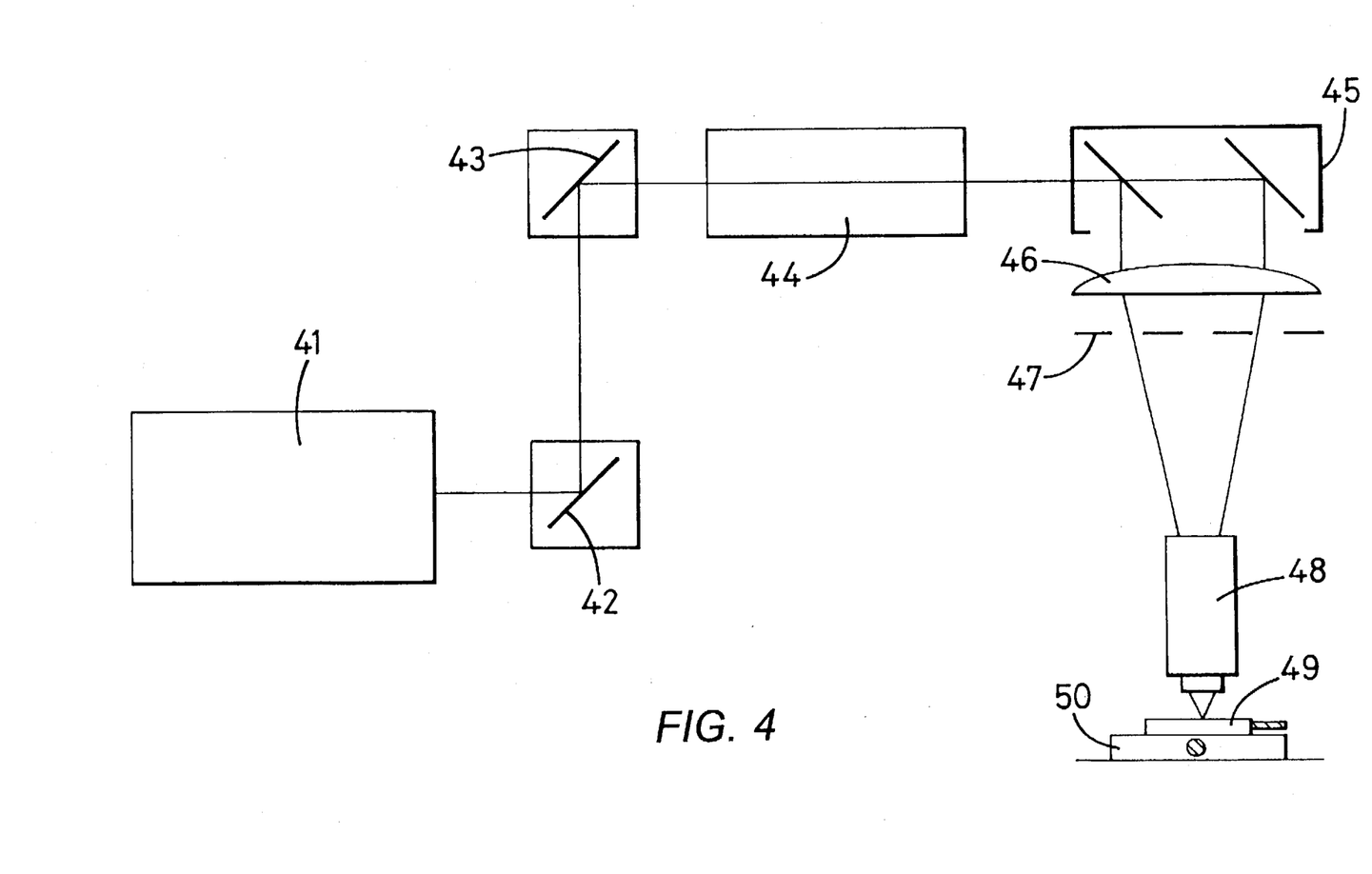
FIG. 4 shows a schematic representation of apparatus for performing a process of the type shown in FIG. 2.

FIG. 4 is a schematic illustration of projection processing using an excimer laser. An excimer laser 41 projects a beam via reflection mirrors 42 and 43 through a homogenizer 44. The beam passes through a scanning unit 45 to a field lens 46, which converges the beam through a mask 47 into an imaging lens 48. The imaging lens 48 focuses the beam onto a film/substrate 49, mounted on an X,Y,Z positioning system 50.

It would also be possible to use an image projection technique employing lenses to direct a beam of laser light onto specific predetermined parts of the material to define the pattern, without the need to use a mask.

The laser can be a long wavelength laser such as a CO2 or Nd:YAG laser, but is preferably an excimer (excited dimer) laser for producing an intense burst of ultraviolet light in a wavelength range from approximately 193 to approximately 353 nm. Such short wavelength photons are sufficiently energetic to interact directly with the chemical bonds which hold most materials together, causing rapid dissociation and material removal. Other lasers using longer wavelength use heat to cut or drill the material, but a UV excimer laser machines the material without any significant heating of the material. As many materials absorb strongly in the ultraviolet range, the interacting photons cause rapid bond breaking in a very thin surface layer (typically 0.5 to 1 micron deep). When the photon density is high enough, the rate of bond scission exceeds that of re-combination, and the rapid dissociation of the molecules into smaller sized components causes a dramatic increase of pressure within the irradiated layer. The dissociated material is ejected at high velocity, carrying away excess energy and leaving the unexposed material unheated and undamaged. Thus when using excimer lasers, thermal effects such as melting, flowing, and debris formation are eliminated. A very well defined structure is created very quickly.

Typically, a 10 ns burst of radiation can remove a layer a quarter of a micron deep, and at least 1000 pulses per second can be generated.

A direct consequence of the use of a laser is that the plastic layer 2 can be used as a backing instead of a solid steel plate, and this enables processing in continuous strip form to be carried out rather than in batches.

It may be considered that it is possible to process metal film 1 having the desired final thickness directly using a laser. However, laser processing times may be reduced and foil geometry improved (for dry shaving applications) by patterning a relatively thin film (e.g. 0.01 to 0.05 microns thick or up to 0.25 microns thick) and performing a subsequent thickening step. The thickening step may be performed by electrodeposition or by electroless methods such as non-electrolytic deposition from solution. Obviously, if electrodeposition is used, the initial patterned film must be electrically conductive, preferably metallic.

However, if electroless deposition methods are used, electrical conductivity is not essential. The patterned film need only be one capable of initiating an electroless reduction process, to produce a deposit of metal which can then be further thickened by deposition (electroless or electrodeposition).

Instead of using a laser however, a thin metallized substrate can be coated with a layer of photoresist, which can then be exposed with a pattern defined by a photographic artwork or other mask. After development, the substrate may be left with a metal e.g. silver, pattern corresponding to the required foil. The pattern can then be thickened by electroforming or by electroless methods.

In one preferred method, an excimer laser is employed to ablate a very thin metal film (e.g. copper at a thickness of 0.01 microns) to define the initial pattern. An electroless deposition process (as hereinafter described) is then employed to build up the thickness to about 0.2 microns. Following this, a normal electroforming process is employed to build the thickness to the required final value, e.g. 60 microns.

Such thickening processes may be performed continuously or semi-continuously by drawing the substrate (e.g. plastic backing) with the patterned film through an appropriate sequence of processing stations, e.g. chemical baths.

Where the substrate is flexible, it can be shaped around mandrels or corrugations on a transport member to produce thickened foils already in an arched configuration as required for applications as a cutting foil for a dry shaver.

These methods will now be described in detail with reference to FIGS. 5 to 9.

FIGS. 5a–d show four steps a–d in the manufacture of a simple mesh which may be employed for example as a filter or sieve. In a first step a, a continuous substrate 51 of plastics material is provided with thin metal layers 2, e.g. by sputtering. Whilst this technique is well known to persons skilled in the art, the importance of maintaining good adhesion between the metal and the plastics material should be particularly noted. The metal layer 52 may have a thickness for example of 0.25 microns. In step b, the metal film is then patterned, e.g. by using an excimer laser by any of the techniques shown in FIGS. 1–4. This results in a patterned metal film 52 on the plastics film 51, as shown in step b illustrated in FIG. 5b.

Figure 5A:
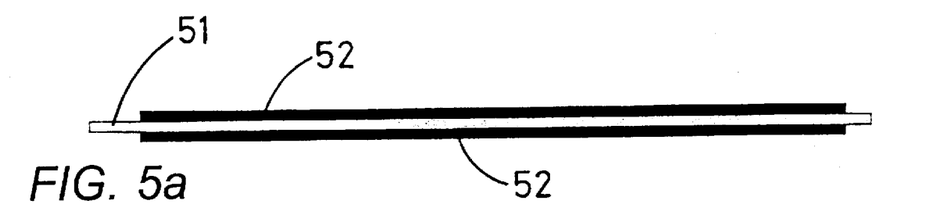
FIGS. 5a–d show four steps a, b, c and d for the manufacture of a simple mesh, e.g. a filter.
Figure 5B:
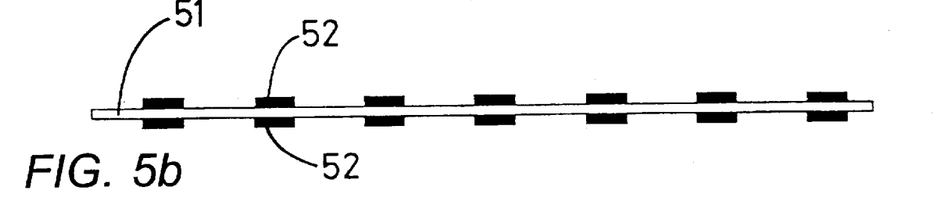
Figure 5C:
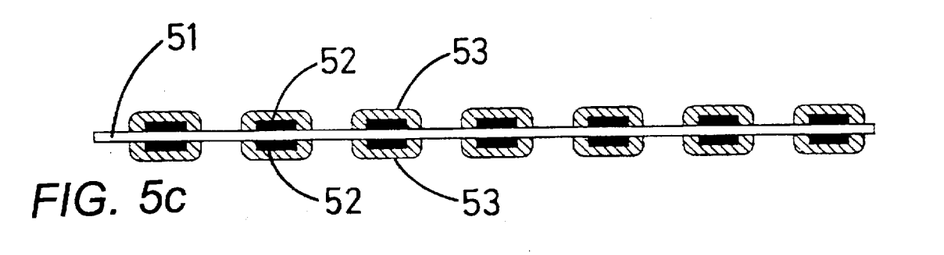
Figure 5D:
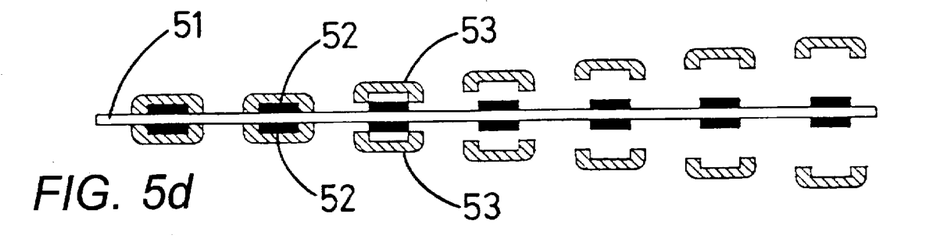

An electroforming operation is then performed to electrodeposit a metal mesh 53 onto the metal pattern 52, to result in the intermediate product shown in step c illustrated in FIG. 5c. As shown in step d, the metal mesh 53 may then be peeled away from the carrier substrate 51 and the patterned metal film 52.

Although as shown in FIGS. 5a–d processing is performed on both major surfaces of the plastics substrate 51, it is of course possible also to process only one side if desired.

FIGS. 6a–e show a process for the production of a foil suitable for dry shavers.

Figure 6A:
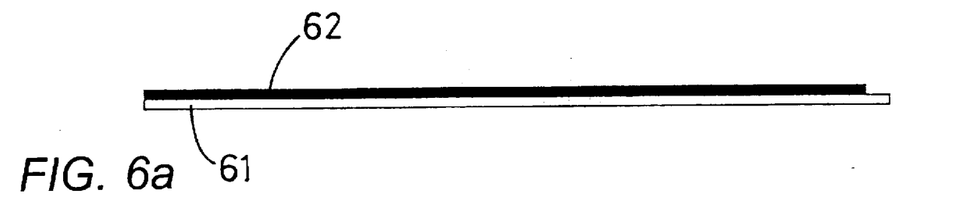
FIGS. 6a–e show five steps a, b, c, d and e for the manufacture of a foil for a dry shaver.
Figure 6B:
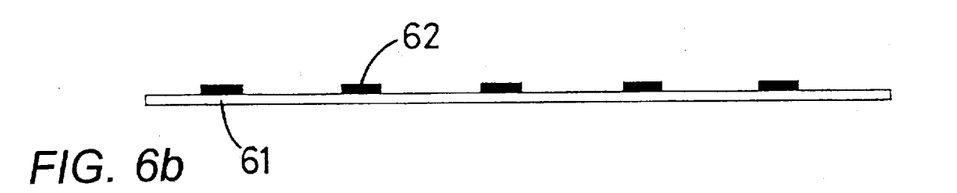
Figure 6C:
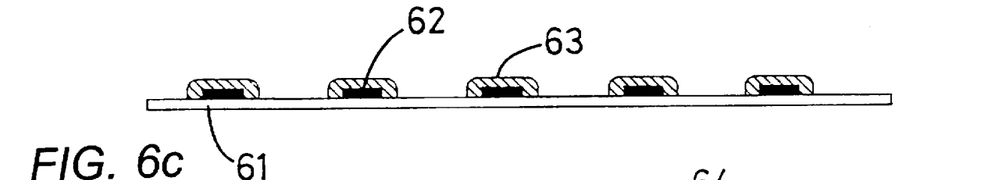
Figure 6D:
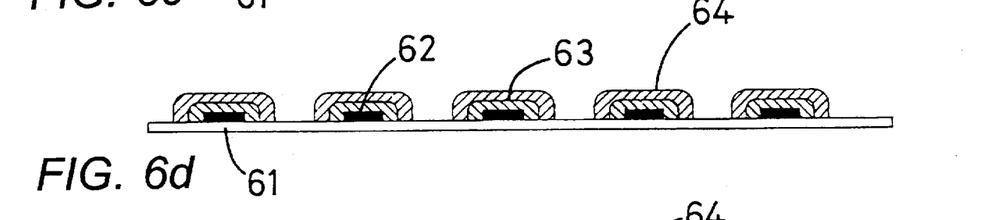

Step a of illustrated in FIG. 6a a continuous plastic substrate 61 carrying a thin metal film 62, which may be applied by sputtering as in the embodiment of FIGS. 5a–d. Again, the importance of maintaining good adhesion between the metal and the plastics material should be noted. Moreover, although the metal layer 62 is shown on only one side of the plastics substrate 61, it may also be provided on both sides as in the embodiment of FIGS. 5a–d.

After patterning, e.g. employing the method of any of FIGS. 1–4, a metal pattern 62 of thickness approximately 0.25 microns, is retained on the substrate of thickness 50 microns. As shown in step c, electrodeposition of a prenickel layer 63, to an overall thickness of 25 microns, is performed.

Figure 6E:
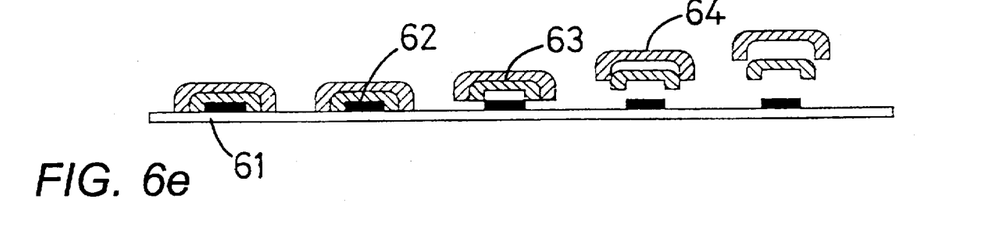

The pre-nickel layer is then passivated, and a further layer of nickel 64 is then electrodeposited onto the prenickel layer 63 to form the shaver foil. This is shown in step d illustrated in FIG. 6d. After the electrodeposition of the foil 64, the overall thickness of the metal deposition is approximately 60 microns. Finally, as shown in step e, the electroformed meshes are separated from the carrier film 61 and the shaver foil 64 is separated from the pre-nickel layer 63.

Figure 7:
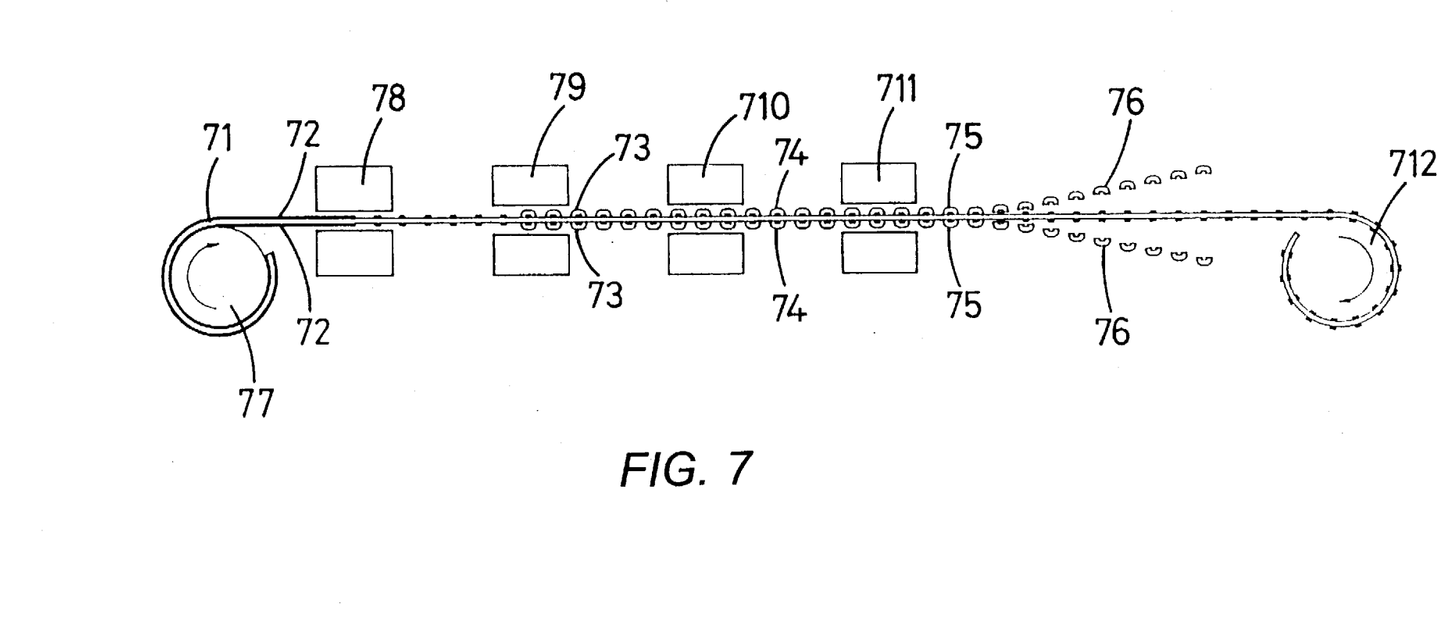
FIG. 7 shows reel to reel type processing for shaver foils.

It has already been mentioned that foils may be manufactured continuously or semi-continuously by drawing the substrate with the patterned film through an appropriate sequence of processing stations. FIG. 7 shows in more detail how this may be achieved using reel to reel type processing.

In FIG. 7, a continuous plastics substrate 71, carrying thin metal films 72, is withdrawn from a coil 77. The substrate passes through laser etching equipment 78 to produce a metal pattern on the plastics substrate. The substrate with the metal pattern then passes through an electroforming tank 79 for the deposition of a pre-nickel foil 73. The intermediate product then passes through a passivation tank 710 to provide a separating layer 74 on the surface of the pre-nickel 73. The strip then passes through a main electroforming tank 711 for the electrodeposition of shaver foil metal 75 onto the passivated pre-nickel layer 73. The electroformed foils 76 are then separated from the carrier film 71, which is wound onto a take off reel 712.

Figure 8:
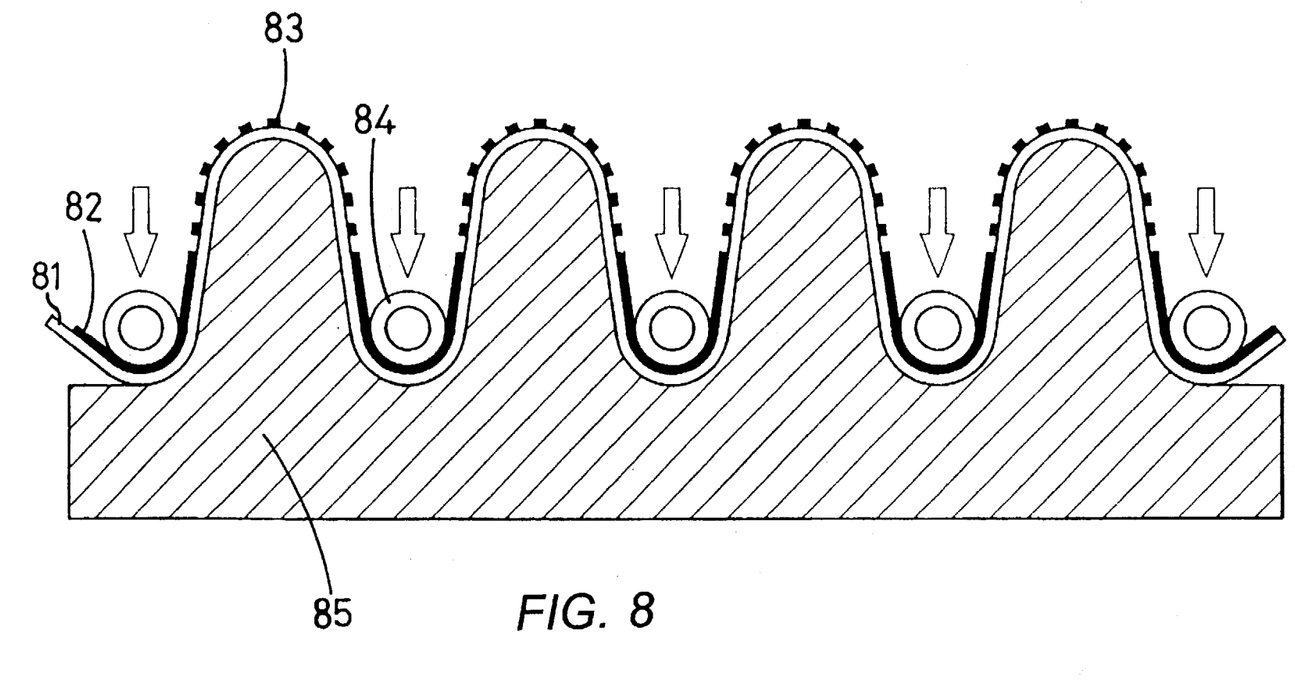
FIG. 8 shows a method of electroforming shaver foils in an arched condition.

Referring now to FIG. 8, a way of electroforming shaver foils in the arched condition is illustrated. The Figure illustrates an arched former 85 having pressure rollers 84 holding a metallised substrate 81, 82 in close contact with the profile of the former 85. The laser etched metal pattern 83 is positioned on the crest of the arch. The substrate together with the former is conveyed through the electroforming tank, as shown in FIG. 7, to produce the shaver foil in the arched condition.

Forming foils in the arched condition is of advantage for the following reasons. For a comfortable and efficient shave, the underside of the shaving foil of an electric razor must be in intimate contact with the undercutter. If the foil separates from the under cutter, hairs are pulled rather than sheared, which leads to discomfort and inefficient shaving. It is conventional to produce shaver foils by electroforming in a flat condition. These flat foils inserted in the head of the shaver are then curved to take up the approximate profile of the undercutter. When the foil head is attached to the razor, the undercutter is pressed against the underside of the foil, thus forcing the foil to conform to the profile of the undercutter.

Recent shaver designs have adopted smaller heads and multiple foils curved to a tighter radius. This makes it more difficult to force a flat formed foil to adopt the exact profile of the undercutter. This is because the foil tends to "notch" creating microseparations from the undercutter and bulging away from the undercutter when pressure is applied to the outer surface of the foil. To achieve improved shaving performance, new shaver designs may incorporate even smaller foils which cannot be shaped from flat electroforms. By inserting the flat foil in a profile jig and heating the assembly, the flat foil can be formed to the approximate shape required, but some relaxation of the shape always occurs when the foil is removed from the jig. Moreover, the heat treatment must be carried out slowly at only a modest temperature to prevent embrittlement of the nickel, and therefore presents processing problems.

By using the method illustrated with reference to FIGS. 7 and 8, or of Example 3 hereinafter described, foils can be electroformed in the arched condition so that they intrinsically possesss the profile of the undercutter. It has been demonstrated that such foils give superior initial shaves as compared with foils electroformed in the flat condition. Although the use of a profiled mandrel (Example 3) may be impractical for mass production, it is possible to employ a flexible strip on which to electroform the foil and the flexible strip can be tensioned over profiled formers, and moved continuously or intermittently, thus allowing the mass production of pre-arched foils, as already described with reference to FIG. 8.

More detail will now be given of an electroless process for thickening up the patterned film. A chemical metallizing process may, for example, be employed. For example, alkali copper sulphate solution, containing complexing agents, reacts with formaldehyde in the presence of a catalyst to cause the deposition of copper. The same conditions apply to the chemical deposition of nickel from nickel solutions containing sodium hypophosphite or alkylamineborane. A thin layer of copper or nickel is sufficiently catalytically active to catalyse the deposition process.

A similar chemical metallizing technique can also be employed to form the initial metallized plastic substrate on which the pattern of holes is created by the laser. Such a metallized substrate may be formed in an aqueous solution by chemical reduction of metal ions onto a plastic surface in the presence of a catalyst. Suitable catalysts are finely dispersed precious metal nuclei formed on the surface by activation, and possibly contaminants in the metallizing solutions. The required electrons are supplied by a reducing agent which is also present in the solution containing metal ions. Alternatively, the reducing agent and metal ions may be mixed on the plastic surface, e.g. by spray coating. The immersion method is, however, preferred and is particularly suitable for chemical deposition of copper and nickel. Formaldehyde is mainly used for reducing copper ions. Nickel ions are reduced with sodium hypophosphite or borohydride compounds.

The reaction continues to occur when the precious metal nuclei are covered with copper or nickel, since these metals are also electron conductors. The nuclei act as catalysts for the reduction as long as their surface is not coated with a non-conductor (oxide etc.). Nucleation first begins on the precious metal compounds, since they can be reduced more easily than other metal ions. The reaction partners, copper or nickel ions and the reducing agent, remain adsorbed for some time on the catalytic nuclei so that electron exchange can take place as desired.

A plastic substrate may also be provided with a thin metal layer by chemical vapour deposition (CVD) or sputtering.

Suitable plastic substrate materials are polyimides, polypropylene and polyester (e.g. Mylar).

Figure 9:
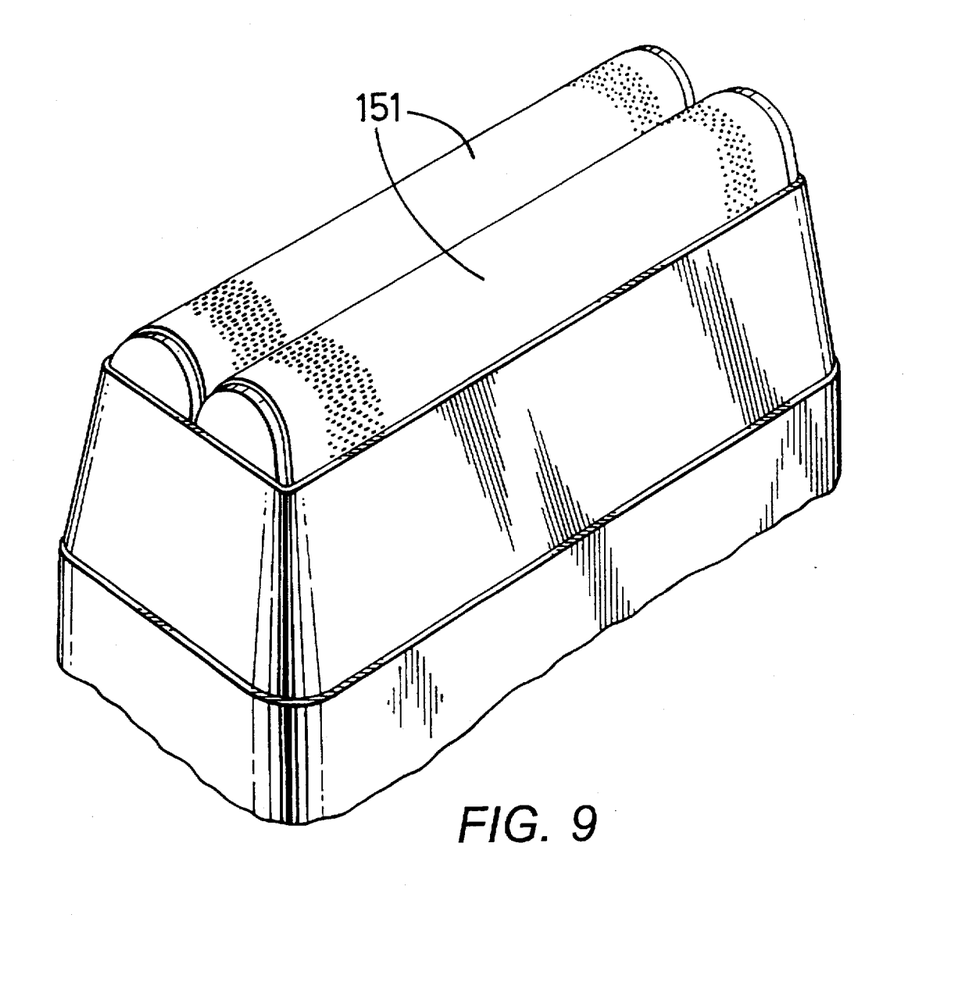
FIG. 9 shows a dry shaver with two arched foils in place, each manufactured with a pattern of holes.

The final form of the foil is shown in FIG. 9. This shows two arched foils 151 in place on the head of a razor.

Various forms of patterning are possible, depending on the mask used, but in the illustration in FIG. 9 the patterning in the centre of the foils is not shown to improve the clarity.

Methods according to the invention may enable manufacturing units to be more compact and processing times to be faster due to the use of in line processing rather than batch processing. Furthermore, effluent generation can be reduced by avoiding any photo resist stage, and less effluent is produced in the electroforming operations since they can be in-line operations rather than batch operations. Also, since a flexible plastic film can be used, thickened foils can be produced in the arched condition.

Clearly, when employed to produce foils for dry shavers, nickel or nickel alloy is the preferred material. Filters or sieves could however be manufactured of copper or copper alloy. It will be appreciated that whilst the initial starting material is referred to as a metallised film, in principle any electrically conductive film supported on a non-conductive (electrically insulating) substrate could be used.

The invention is further illustrated by means of the following non-limiting examples.

EXAMPLE 1

A 50 micron thick polyimide film was sprayed with silver to give a metal film of thickness about 0.15 microns. The metallized film was placed beneath an excimer laser beam of wavelength 248 nm and an electroformed nickel mask was interposed between the beam and the film. The laser beam cross section was 8 mm×4 mm and the metallised foil and mask was manipulated beneath the beam by means of a computer controlled x-y table so that all the mask was exposed to the laser beam. Laser light incident on the nickel of the mask was completely stopped but the beam passed through the apertures in the mask and completely removed the silver from the plastic film where it was exposed through the apertures in the mask. After the laser treatment, the pattern of the mask was reproduced on the metallised foil. The patterned plastic film was next jigged and immersed in a conventional nickel sulphamate electroforming solution and nickel deposited onto the silver pattern remaining after the laser etching. Because the thickness of silver was low and only had a small current carrying capacity, nickel deposition was started at a low current density, 80 A/m$^2$, and the current slowly increased until it reached the full operating current density of 450 A/m$^2$. Deposition at full current was continued for 60 minutes to produce a nickel thickness of about 50 microns. After drying, the nickel was peeled from the plastic carrier strip. The nickel electroform was a mesh with the same pattern used for the mask for laser etching. This mesh could be used as a strainer or filter.

EXAMPLE 2

A polyester film of thickness 50 microns was sputter coated with copper to thickness of about 0.2 microns. The metallized film was laser etched in the same manner as the sample of Example 1 but in this case the mask was for an electric razor foil; the pattern of the mask was reproduced in the metal film. The patterned plastic film was jigged and immersed in a conventional nickel sulphamate electroforming solution and nickel deposited on the copper pattern remaining after laser etching. Because the thickness of the copper was low and only had a small current carrying capacity, nickel deposition was started at a low current density, 80 A/m$^2$, and the current slowly increased until it reached the full operating current density of 450 A/m$^2$. Deposition at full current was continued for 35 minutes when the film was removed and immersed for 5 minutes in a solution of sodium metabisulphite to passivate the surface of the nickel. The passivated film was re-immersed in the nickel sulphamate solution and nickel deposition continued at 450 A/m$^2$ for 70 minutes. After this time the film was removed and the electroformed mesh detached. The two layers of nickel were separated at the passivation layer; the second thicker layer was the electric razor foil and had the pattern of the mask used for the laser etching operation.

EXAMPLE 3

A polyester film of thickness 50 microns was sputter coated with copper to thickness of about 0.2 microns. The metallized film was laser etched in the same manner as the sample of Example 2 but in this case the wavelength of the laser light was 308 nm; the pattern of the mask was reproduced in the metal film. The patterned metallized plastic film was attached to a plastic mandrel that had been machined to the profile of an electric razor foil when inserted in the shaving head of a razor. This film was electroformed in the same manner as Example 2. When the electroformed foil was removed from the plastic carrier strip and the two nickel layers separated at the passivation layer, the resultant razor foil was arched and conformed to the profile of the mandrel used during electroforming.

EXAMPLE 4

A polyester film of thickness 50 microns was sputter coated with copper to thickness of about 0.1 microns. The metallized film was laser etched in the same manner as the sample of Example 2. Because the copper coating was very thin and had very small current carrying capacity, before nickel electroforming, the pattern was thickened by depositing on to it copper from a conventional copper plating solution operated at a current density of 40 A/m$^2$. When the copper thickness was about 1 micron, the plastic film was transferred to a conventional nickel electroforming solution and the electroforming carried out as described in Example 2 except that the nickel was deposited only at a current density of 450 A/m$^2$. The resultant razor foil had the pattern of the mask used for the laser etching.

EXAMPLE 5

A polyester film of thickness 50 microns was sputter coated with copper to thickness of about 0.07 microns. The metallized film was laser etched in the same manner as the sample of Example 2. Because the copper coating was very thin and had very small current carrying capacity, before nickel electroforming, the pattern was thickened by depositing on to it copper from a conventional electroless copper plating solution. When the copper thickness was about 0.3 microns, the plastic film was transferred to a conventional nickel electroforming solution and the electroforming carried out as described in Example 2. The resultant razor foil had the pattern of the mask used for the laser etching.

EXAMPLE 6

A 50 microns thick polyimide film was sprayed with silver to give a metal film thickness of about 0.2 microns. The metal film was coated with an electrophoretic photoresist at a thickness of about 5 microns. Using a photographic artwork of the pattern of an electric razor foil, the photoresist was exposed and developed using conventional techniques. The silver exposed after development of the photoresist was stripped in a solution of sulphuric acid and hydrogen peroxide. The remaining photoresist was then stripped to leave the plastic film with the silver patterned to that of the required shaver foil. The film was then jigged and electroformed by the same procedure as used in Example 2. After separating the two electroformed layers, the thicker metal foil was suitable for use as the shaving foil for an electric razor.

We claim:

1. A method of manufacturing a perforated foil comprising the steps of:
   providing an electrically conductive film supported on a substrate, using a laser to create a pattern of holes in said film by removing material from said film but not from said substrate in a process that includes photochemical ablation; and
   thickening said patterned film.

2. The method of claim 1 wherein said laser is an excimer laser.

3. The method of claim 1 wherein said laser is an ultraviolet laser.

4. The method of claim 1 and further including the step of using a suitable mask technique with said laser to create said pattern of holes.

5. The method of claim 1 wherein said film is metallic.

6. The method of claim 1 wherein said substrate is electrically insulating.

7. The method of claim 1 wherein substrate is substantially undamaged by said hole creation step, and further including the step of removing said thickened film from said substrate.

8. The method of claim 1 wherein said film is in continuous strip form.

9. The method of claim 1 in which said thickening step includes forming at least one layer of material that contains metal selected from the group consisting of nickel and copper on said patterned film.

10. The method of claim 1 wherein said thickening step includes an electroforming operation.

11. The method of claim 1 wherein said thickening step includes electroless deposition.

12. The method of claim 1 wherein said thickening step is carried out using a continuous reel to reel type plating unit.

13. The method of claim 1 wherein the thickness of said film before said thickening step is between 0.01 and 0.25 microns.

14. The method of claim 1 further comprising the step of maintaining said film in an arched condition during at least a portion of said thickening step such that the perforated foil maintains an arched shape when no external force is applied.

15. A dry shaver foil manufactured according to the method of claim 14.

16. The dry shaver foil of claim 15 wherein said foil is of nickel.

17. A filter manufactured of a metal selected from the group consisting of copper and nickel according to the method of claim 14.

18. The method of claim 14 wherein said shape maintaining step is achieved by attaching said film to a mandrel having the desired profile.

19. The method of claim 14 wherein said shape maintaining step is achieved by passing said film over a profiled former.

20. The method of claim 19 further including the step of moving said film moved across the surface of said former.

21. The method of claim 20 wherein said film is moved intermittently across said surface of said former.

22. The method of claim 1 wherein said thickening step comprises the steps of forming a preliminary metal layer on said film; passivating said preliminary metal layer; and forming a main metal layer on said preliminary metal layer.

23. The method of claim 22 wherein said preliminary metal layer is about twenty-five microns thick and said main metal layer is about sixty microns thick.

24. A method of manufacturing a dry shaver comprising the step of making a foil of nickel by the steps of claim 1.

25. A method of manufacturing a perforated foil comprising the steps of:

providing an electrically conductive film supported on an electrically insulating substrate, creating a pattern of holes in said film substantially without damaging said substrate;

thickening said patterned film; and removing said thickened film from said substrate.

26. The method of claim 25 wherein said step of creating said pattern of holes includes the use of a laser.

27. The method of claim 26 wherein said laser creates said holes by removing material from said film in a mainly photochemical ablative process.

28. The method of claim 26 wherein said laser is an excimer laser.

29. The method of claim 26 wherein said laser is an ultraviolet laser.

30. The method of claim 26 wherein said step of creating said portion of holes includes the use of an image projection technique with said laser to create said pattern of holes.

31. The method of claim 25 wherein said film includes a layer of photoresist on said film, and said step of creating said pattern of holes includes the steps of patterning said layer of photoresist and developing said layer of photoresist.

32. The method of claim 25 wherein said film is metallic.

33. The method of claim 25 wherein said substrate is a layer of synthetic plastics material.

34. The method of claim 25 wherein said substrate is flexible.

35. A method of manufacturing a perforated dry shaver foil comprising the steps of:

providing an electrically conductive film supported on an electrically insulating substrate, the thickness of said electrically conductive film being between 0.01 and 0.25 microns, creating a pattern of holes in said film substantially without damaging said substrate;

thickening said patterned film including the steps of forming a preliminary metal layer on said film; passivating said preliminary metal layer; and forming a main metal layer on said preliminary metal layer, said preliminary metal layer being about twenty-five microns thick and said main metal layer being about sixty microns thick; and removing said main metal layer from said substrate for use as said dry shaver foil.

36. The method of claim 35 wherein said main metal layer is of nickel.

37. The method of claim 35 further comprising the step of maintaining said film in an arched condition during at least a portion of said thickening step such that the perforated foil maintains an arched shape when no external force is applied.

38. A dry shaver foil manufactured according to the method of claim 37.

39. The method of claim 35 wherein said step of creating said pattern of holes includes the use of a laser to remove material from said film in a mainly photochemical ablative process.

* * * * *